(12) United States Patent
Dirscherl et al.

(10) Patent No.: US 9,484,508 B2
(45) Date of Patent: Nov. 1, 2016

(54) OPTOELECTRONIC SEMICONDUCTOR COMPONENT

(71) Applicant: OSRAM Opto Semiconductors GmbH, Regensburg (DE)

(72) Inventors: Georg Dirscherl, Tegernheim (DE); Walter Wegleiter, Nittendorf (DE); Caroline Cassignol, Munich (DE); Karl Weidner, Munich (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/430,539

(22) PCT Filed: Sep. 24, 2013

(86) PCT No.: PCT/EP2013/069811
§ 371 (c)(1),
(2) Date: Mar. 23, 2015

(87) PCT Pub. No.: WO2014/048905
PCT Pub. Date: Apr. 3, 2014

(65) Prior Publication Data
US 2015/0270459 A1 Sep. 24, 2015

(30) Foreign Application Priority Data
Sep. 27, 2012 (DE) .................. 10 2012 109 177

(51) Int. Cl.
*H01L 33/62* (2010.01)
*H01L 33/56* (2010.01)
*H01L 33/48* (2010.01)
*H01L 33/50* (2010.01)
*H01L 33/54* (2010.01)

(52) U.S. Cl.
CPC ............. *H01L 33/56* (2013.01); *H01L 33/486* (2013.01); *H01L 33/505* (2013.01); *H01L 33/54* (2013.01); *H01L 33/62* (2013.01); *H01L 2924/0002* (2013.01)

(58) Field of Classification Search
CPC ............................................. H01L 2924/0002
See application file for complete search history.

(56) References Cited

U.S. PATENT DOCUMENTS 6,483,196 B1 11/2002 Wojnarowski et al.
2007/0148390 A1* 6/2007 Kumar .................. A61L 27/34
428/36.91

(Continued)

FOREIGN PATENT DOCUMENTS

DE 102011013821 A1 9/2012
WO 2009/156856 A2 12/2009

OTHER PUBLICATIONS

Schnitzer, I. et al: "30% external quantum efficiency from surface textured, thin-film light-emitting diodes"; Appl. Phys. Lett. vol. 63, No. 15, Oct. 18, 1993, pp. 2174-2176.

*Primary Examiner* — Alexander Ghyka
(74) *Attorney, Agent, or Firm* — McDermott Will & Emery LLP

(57) ABSTRACT

The invention relates to an optoelectronic semiconductor component, which has a carrier element (1), on which an optoelectronic semiconductor chip (2) having at least one active layer is arranged, wherein the active layer is designed to emit or receive light during operation and wherein the semiconductor chip (2) is covered with a protective layer (3) that contains poly-para-xylenes.

10 Claims, 2 Drawing Sheets

(56) References Cited

U.S. PATENT DOCUMENTS

| | | | |
|---|---|---|---|
| 2007/0228516 A1* | 10/2007 | Plank | A61C 19/003 257/531 |
| 2010/0119839 A1 | 5/2010 | Chen | |
| 2010/0264432 A1 | 10/2010 | Liu et al. | |
| 2011/0031513 A1 | 2/2011 | Hsieh et al. | |
| 2012/0009698 A1 | 1/2012 | Nakamura et al. | |

* cited by examiner

OPTOELECTRONIC SEMICONDUCTOR COMPONENT

SUMMARY

An optoelectronic semiconductor component is specified.

So-called LED packages are known, comprising at least one light emitting diode chip in a housing or on a carrier which, for protection, is covered with a potting material such as silicone, for example. Depending on the fields of use of such LED packages, for example in automotive applications, they are exposed to damaging environmental influences. By way of example, moisture, damaging gases such as, for example $H_2S$ or $SO_2$ and an atmosphere containing hydrochloric acid should be regarded as critical with regard to the corrosion resistance. The reason for this is a certain permeability of the customary potting materials such as silicone, for example. On account of this permeability those parts of the LED components which are susceptible to corrosion, for example semiconductor materials and metallizations are exposed to the damaging gases and the moisture.

In order to avoid damage, it is possible for example to use other potting materials, for instance on the basis of epoxides, which are less permeable. However, such materials are not stable regarding yellowing and are also moisture-resistant only to a limited extent.

It is at least one object of specific embodiments to specify an optoelectronic semiconductor component comprising a protective layer.

This object is achieved by means of a subject matter according to the independent patent claim. Advantageous embodiments and developments of the subject matter are characterized in the dependent claims and are furthermore evident from the following description and the drawings.

In accordance with at least one embodiment, an optoelectronic semiconductor component comprises a carrier element, on which an optoelectronic semiconductor chip having at least one active layer is arranged, said at least one active layer being designed to emit or to receive light during the operation of the semiconductor component. Furthermore, the optoelectronic semiconductor component comprises a protective layer, with which the semiconductor chip is covered and which comprises parylene.

In accordance with one particularly preferred embodiment, the protective layer consists of parylene.

The protective layer can form, in particular, a topmost layer, that is to say an outer layer, of the optoelectronic semiconductor component. Such a layer can also be designated as terminating layer and forms that layer which, in the completed semiconductor component, can be directly in contact with gases and moisture from the surrounding atmosphere.

The term parylenes, and likewise the terms parylene and parylene polymer, here and hereinafter denote aromatic polymers from a group of thermoplastic polymers which comprise phenylene radicals linked via ethylene bridges in the 1,4 position and which can for example also be designated as poly-para-xylylene or poly-p-xylylene.

The protective layer comprises, in particular, polymers having the molecular structure

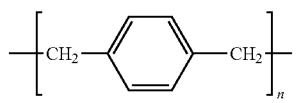

wherein n can be in the range of 10 to 500 000.

Instead of the materials having the structural formula shown, in said materials the hydrogen atoms can also be at least partly or entirely substituted by halogens, for example by bromine, chlorine and/or preferably fluorine atoms. In particular, the parylene can be a fluorine-substituted parylene, which is also known by the name parylene F:

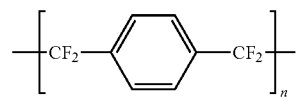

Such parylenes may be stable even at high temperatures, that is to say that they are stable enough not to degrade mechanically and/or optically at high temperatures, such that the optoelectronic semiconductor component can be processed further at high temperatures, for example during soldering processes. Such use conditions may be typical, for example, for semiconductor components which are mounted on carriers by means of soldering processes such as reflow soldering processes, for instance, at temperatures of up to 260° C.

Furthermore, the parylene can for example also be a combination of two or more parylene derivatives, that is to say for example a combination of parylene derivatives having different numbers of substituents and/or different substituents, for example different halogens.

The protective layer described here forms, in particular, a barrier layer in relation to damaging environmental influences such as, for instance, moisture and damaging gases, for instance oxygen, $H_2S$ and $SO_2$. In this case, the barrier effect and sufficient protection against corrosion are already achieved with thin layer thicknesses of the protective layer, as was able to be demonstrated by the inventors in corresponding preliminary experiments.

The protective layer can be deposited, in particular, from the gas phase in vacuo. This results in pore-free application of the protective layer, as a result of which structures such as tips, gaps and edges can be coated uniformly, which is not possible with liquid-based methods, for example.

Alongside the advantage of uniform reshaping and gap penetration, the protective layer has optical and mechanical properties required for optoelectronic semiconductor components, in particular, for example a low permeability to moisture and a low moisture absorption and also a sufficient gas impermeability, which was able to be demonstrated in the context of salt spray tests and tests concerning protection against corrosion. Furthermore, the protective layer described here is highly transparent and can have a transparency of more than 95% in the visible spectral range. Furthermore, the protective layer described here is UV-stable, that is to say that the protective layer does not degrade or undergo yellowing as a result of light having a wavelength in the range of 450 to 460 nm. Furthermore, it was possible to demonstrate a thermal stability at 150° C. in continuous operation and in reflow soldering methods at 260° C. for eight minutes.

The protective layer described here has a good adhesion on all customary semiconductor and carrier element materials and also metallizations, for example on customary potting materials such as silicone, for example, and also metal surfaces such as Ni/Au, Cu, Al, Ag, for example. Moreover, the protective layer comprising the parylene as described here affords high protection against abrasion. On glass substrates and metallized substrates it was possible to demonstrate that all reliability tests can be passed successfully.

In comparison with the customary potting and encapsulation materials, the protective layer described here thus has a higher reliability, in particular a more uniform layer and also absence of gaps, and furthermore better optical properties, which can be achieved by virtue of a thin layer thickness and a high transparency, as a result of which a more efficient luminous efficiency can arise for example in the case of light emitting semiconductor components. The possibility of applying the protective layer comprising parylene as described here with a thin layer thickness results in a material saving and thus also a saving of costs, in particular also by virtue of the fact that it is possible to use less expensive metals that are more susceptible to corrosion for contact-connections.

By virtue of the herein described coating of the optoelectronic semiconductor component with the protective layer comprising parylene or the derivatives thereof, it was possible to demonstrate that the requirements with regard to reliability which are made of optoelectronic semiconductor components can be satisfied.

The optoelectronic semiconductor chip comprises, in particular, an optoelectronic semiconductor layer sequence, particularly preferably an epitaxially grown semiconductor layer sequence. The semiconductor layer sequence is preferably based on a III-V compound semiconductor material. The semiconductor material is preferably a nitride compound semiconductor material such as $Al_xIn_{1-x-y}Ga_yN$ or a phosphide compound semiconductor material such as $Al_xIn_{1-x-y}Ga_yP$ or an arsenide compound semiconductor material such as $Al_xIn_{1-x-y}Ga_yAs$, wherein in each case $0 \leq x \leq 1$, $0 \leq y \leq 1$ and $x+y \leq 1$ hold true. The semiconductor layer sequence here can comprise dopants and additional constituents. For the sake of simplicity, however, only the essential constituents of the crystal lattice of the semiconductor layer sequence, that is to say Al, As, Ga, In, N or P, are indicated, even if these can be replaced and/or supplemented in part by small amounts of further substances.

The semiconductor layer sequence comprises at least one active layer which is designed for generating or for receiving light in an ultraviolet to infrared wavelength range. The active layer includes, for example, at least one pn junction or, preferably, one or a plurality of quantum well structures. The light which is generated by the active layer during operation or is provided for reception is in a visible spectral range, in particular.

The optoelectronic semiconductor layer sequence can emit light during operation, for example, and for this purpose can be embodied as a light emitting semiconductor chip, for instance as a light emitting diode (LED), as an edge emitting semiconductor laser, as a vertically emitting semiconductor laser (VCSEL), as a laser array, as a laser bar or as a plurality or combination thereof, or can comprise at least one or a plurality of the elements mentioned. Alternatively or additionally, the optoelectronic semiconductor layer sequence can receive light during operation and for this purpose can be embodied as a light receiving semiconductor chip, for instance as a photodiode, as a solar cell, as a solar cell panel, as a phototransistor or as a plurality or combination thereof, or can comprise one or a plurality of the elements mentioned.

Particularly preferably, the optoelectronic semiconductor layer sequence can be grown on a growth substrate by means of an epitaxy method, for example metal organic vapor phase epitaxy (MOVPE), or molecular beam epitaxy (MBE). The growth substrate can comprise or be composed of an electrically insulating material or a semiconductor material, for example a compound semiconductor material system mentioned above. In particular, the growth substrate can comprise sapphire, GaAs, GaP, GaN, InP, SiC, Si and/or Ge or be composed of such a material.

The growth process can take place in the wafer assemblage, in particular. In other words, a growth substrate in the form of a wafer is provided, onto which the optoelectronic semiconductor layer sequence is grown over a large area. In a further method step, the grown optoelectronic semiconductor layer sequence can be singulated into individual semiconductor chips for forming a plurality of optoelectronic semiconductor components.

Furthermore, the semiconductor layer sequence can preferably be transferred to a carrier substrate prior to singulation. The carrier substrate can be formed for example by one of the materials mentioned above for growth substrates. Furthermore, it is also possible for the carrier substrate to be formed for example by a metal-containing film or a metal-containing plate, for example a metal film or a metal plate.

After transfer, the growth substrate can be thinned, that is to say at least partly or wholly removed. The carrier substrate together with the semiconductor layer sequence is then singulated in order to form optoelectronic semiconductor chips. Before the semiconductor layer sequence is transferred to a carrier substrate, one or a plurality of mirror layers can be applied for example on a side of the semiconductor layer sequence facing away from the growth substrate. In particular, the one or the plurality of mirror layers can comprise or be composed of a metal, particularly preferably silver. Furthermore, combinations of layers comprising one or a plurality of transparent conductive oxides and comprising one or a plurality of mirror metals or comprising one or a plurality of transparent dielectric materials and comprising one or a plurality of mirror metals are also possible as mirror layer.

Semiconductor chips comprising a carrier substrate instead of the growth substrate can also be designated as so-called thin-film semiconductor chips, in the case of light emitting thin-film semiconductor chips also as thin-film light emitting diode chips.

A thin-film light emitting diode chip can be distinguished, in particular, by the following characteristic features:
- a reflective layer, in particular a mirror layer, is applied or formed at a first main surface—facing toward the carrier substrate—of a light emitting semiconductor layer sequence, said layer reflecting at least part of the electromagnetic radiation generated in the semiconductor layer sequence back into the latter;
- the semiconductor layer sequence has a thickness in the range of 20 µm or less, in particular in the range of 4 µm and 10 µm; and
- the semiconductor layer sequence contains at least one semiconductor layer having at least one area having an intermixing structure which ideally leads to an approximately ergodic distribution of the light in the semiconductor layer sequence, that is to say that it has an as far as possible ergodically stochastic scattering behavior.

A thin-film light emitting diode chip is a Lambertian surface emitter to a good approximation. The basic principle of a thin-film light emitting diode chip is described for example in the document I. Schnitzer et al., Applied Physics Letters 63 (16), Oct. 18, 1993, pages 2174-2176.

Furthermore, on or in the semiconductor layer sequence, electrical contact elements, for example in the form of one or a plurality of electrical contact layers such as, for instance, electrode layers and/or one or a plurality of plated-through holes, can be present, by means of which the optoelectronic semiconductor chip and in particular the active layer can be electrically contacted.

The semiconductor layer sequence can comprise, alongside the active region, further functional layers and functional regions, for instance p- or n-doped charge carrier transport layers, that is to say electron or hole transport layers, undoped or p- or n-doped confinement, cladding or waveguide layers, barrier layers, planarization layers, buffer layers, protective layers and/or electrodes and combinations thereof. Furthermore, additional layers, for instance buffer layer, barrier layers and/or protective layers, can also be arranged perpendicularly to the growth direction of the semiconductor layer sequence for example around the semiconductor layer sequence, that is to say for instance on the side surfaces of the semiconductor layer sequence.

The carrier element can be formed for example by a printed circuit board, a ceramic plate, a ceramic housing, a plastic plate, a plastic housing or a combination thereof. The carrier element can furthermore have electrical connection elements for making electrical contact with the optoelectronic semiconductor chips, for example conductor tracks on the carrier element and/or plated-through holes through the carrier element. The electrical connection elements can have electrical connection regions by means of which the optoelectronic semiconductor component can be contacted externally. If an electrical connection element is embodied as a plated-through hole, then it can preferably project from a mounting surface of the carrier element facing away from the optoelectronic semiconductor chip through the carrier element as far as a side on which the semiconductor chip is arranged. On the mounting surface, a plated-through hole has an electrical connection region.

An electrical contacting of the semiconductor chip can be achieved for example by means of a direct mounting of the semiconductor chip on an electrical connection element. Furthermore, at least one electrical contact structure can be present, by means of which an electrical contacting can be achieved, for example a wire connection such as, for instance, a bonding wire and/or a metal film in the form of a metal film connection, and which extends from an electrical contact element of the semiconductor chip to an electrical connection element of the carrier element and electrically conductively connects the electrical connection element of the carrier element to the electrical contact element of the semiconductor chip. The contact structure can particularly preferably be covered by the protective layer in particularly in the case of a contact structure formed by a metal film.

In accordance with a further embodiment, the semiconductor chip is covered by the protective layer on all sides facing away from the carrier element. This can mean, in particular, that all surfaces of the semiconductor chip that are exposed after the mounting of the semiconductor chip on the carrier element are covered with the protective layer. If the optoelectronic semiconductor component, as described further below, comprises a wavelength conversion layer on the semiconductor chip, then in particular the semiconductor chip and the wavelength conversion layer can be covered by the protective layer on all exposed surfaces facing away from the carrier element.

Here and hereinafter, exposed surfaces denote such surfaces and surface regions which, after the completion of the optoelectronic semiconductor component, can be in contact with the surroundings in the form that, for example, atomic or molecular substances from the surroundings, for instance moisture or damaging gases, can reach the surface. Therefore, a surface or a surface region which is covered by a non-hermetically impermeable layer, for instance a non-hermetically impermeable plastic layer, for example formed by a potting material, can also come under the term exposed in the present case.

In accordance with a further embodiment, the protective layer extends at least onto a part of the carrier element, such that the protective layer covers at least one part of the carrier element. In particular, the protective layer can extend continuously from the semiconductor chip onto the carrier element. As a result, the protective layer can effectively encapsulate for example the interface between the semiconductor chip and the carrier element. Furthermore, materials of the carrier element which are sensitive with respect to the surroundings, for example metal surfaces which are formed by conductor tracks and/or plated-through holes and over which the protective layer extends, can be protected against damaging influences from the surroundings, such as moisture and damaging gases.

In accordance with a further embodiment, the carrier element has a mounting surface designed for mounting the semiconductor component on a carrier. Such a carrier can be formed by a printed circuit board and/or a heat sink, for example. In particular, the protective layer can particularly preferably extend over all surfaces of the semiconductor component apart from the mounting surface, such that all surfaces of the semiconductor component apart from the mounting surface are covered with the protective layer. After the semiconductor component has been mounted on a carrier by means of the mounting surface, the semiconductor component in this case no longer has any surface which faces the surroundings and which is free of the protective layer, with the result that all-round protection against damaging influences from the surroundings can be achieved.

In accordance with a further embodiment, the semiconductor chip is at least partly surrounded by a potting material on the carrier material. By way of example, the potting material can comprise silicone. In particular, the semiconductor chip can be surrounded by the potting material laterally, that is to say in a direction parallel to the interface between the semiconductor chip and the carrier material. What can be achieved as a result is, for example, that the potting material is adjacent to the semiconductor chip or, if appropriate, to a wavelength conversion layer on the semiconductor layer in a planar fashion, such that the optoelectronic semiconductor component can have a planar or substantially planar surface. In particular, the protective layer also covers the potting material, such that the latter can be chosen independently of its properties with regard to a sensitivity or permeability of moisture or damaging gases.

In accordance with a further embodiment, the optoelectronic semiconductor component comprises a wavelength conversion layer arranged on the semiconductor chip. The protective layer can be arranged, in particular, on the wavelength conversion layer, such that the wavelength conversion layer is arranged on the semiconductor chip and below the protective layer. As a result, the protective layer can encapsulate the semiconductor chip and the wavelength conversion layer together. The wavelength conversion layer can be applied for example directly on the semiconductor layer sequence.

The wavelength conversion layer can be designed, in particular, to convert part of the light generated by the semiconductor chip during operation into light having a different wavelength, such that the semiconductor component can emit mixed-colored light, for example white light.

By way of example, the optoelectronic semiconductor chip can be embodied as a blue- or green-emitting semiconductor chip, while the wavelength conversion layer can convert part of the light generated by the semiconductor chip into yellow and/or red and/or green light, such that the emission of white light can be achieved during the operation of the semiconductor component given a suitable choice of the material of the semiconductor chip and the material of the wavelength conversion layer.

The wavelength conversion layer comprises at least one wavelength conversion substance which can be selected from one or more of the following materials: garnets of the rare earths and of the alkaline earth metals, for example YAG:Ce$^{3+}$, nitrides, nitridosilicates, sions, sialons, aluminates, oxides, halophosphates, orthosilicates, sulfides, vanadates and chlorosilicates. Furthermore, the wavelength conversion substance can additionally or alternatively comprise an organic material which can be selected from any group comprising parylenes, benzopyrenes, coumarins, rhodamines and azo dyes.

Furthermore, the wavelength conversion layer can comprise a transparent matrix material which surrounds or contains the wavelength conversion substance or substances or which is chemically bonded to the wavelength conversion substance or substances. The transparent matrix material can comprise for example siloxanes, epoxides, acrylates, methyl methacrylates, imides, carbonates, olefins, styrenes, urethanes or derivatives thereof in the form of monomers, oligomers or polymers and furthermore also mixtures, copolymers or compounds therewith. By way of example, the matrix material can comprise or be an epoxy resin, polymethyl methacrylate (PMMA), polystyrene, polycarbonate, polyacrylates, polyurethane or a silicone resin such as for instance polysiloxane or mixtures thereof.

The wavelength conversion layer can be applied to the optoelectronic semiconductor chip by spraying, dropwise application, sedimentation or electrophoresis. As an alternative thereto, it may also be possible for the wavelength conversion layer to be embodied as a prefabricated laminar comprising one of the abovementioned matrix materials and a wavelength conversion substance. Furthermore, the wavelength conversion layer can also be embodied as a ceramic wavelength conversion layer comprising a ceramic wavelength conversion substance or comprising a ceramic wavelength conversion substance and a ceramic matrix material.

Further advantages, advantageous embodiments and developments will become apparent from the exemplary embodiments described below in association with the figures.

BRIEF DESCRIPTION OF THE DRAWINGS

In the figures.

DETAILED DESCRIPTION

In the exemplary embodiments and figures, elements that are identical, of identical type or act identically may be provided in each case with the same reference signs. The illustrated elements and their size relationships among one another should not be regarded as true to scale; rather, individual elements such as, for example, layers, component parts, components and regions may be illustrated with exaggerated size in order to enable better illustration and/or in order to afford a better understanding.

In association with the figures, exemplary embodiments of optoelectronic semiconductor components are described, which are embodied purely by way of example as light emitting semiconductor components. The semiconductor layer chips 2 described in association with the figures therefore each have an active layer suitable for emitting light during operation and can be embodied as light emitting diode chips, for example. For this purpose, the semiconductor chips 2 can have a semiconductor layer sequence comprising a compound semiconductor material described above in the general part on a growth substrate or a carrier substrate. Furthermore, it is also possible for the semiconductor chips 2 to be embodied as so-called carrierless semiconductor chips, in which the growth substrate has been thinned or detached and no carrier substrate is present.

The exemplary embodiments described below are, however, not restricted to light emitting semiconductor chips and light emitting semiconductor components. Rather, in the exemplary embodiments described, alternatively or additionally, provision can also be made of light receiving semiconductor chips having a light receiving semiconductor layer sequence having at least one light receiving active layer.

Figure 1:
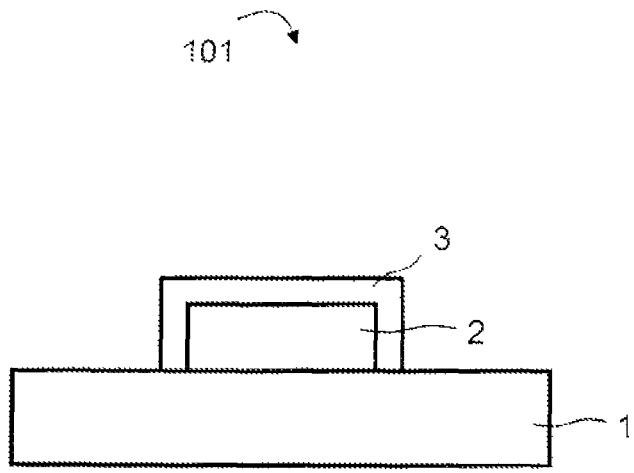
FIG. 1 shows a schematic illustration of an optoelectronic semiconductor component in accordance with one exemplary embodiment.

FIG. 1 shows one exemplary embodiment of an optoelectronic semiconductor component 101, wherein an optoelectronic semiconductor chip 2 is arranged on a carrier element 1. The carrier element 1 can be formed for example by a plastic housing, a plastic plate, a ceramic housing, a ceramic plate, a printed circuit board or a combination thereof. By way of example, the carrier 1 can be a so-called premold package, wherein a plastic material is molded around a leadframe in order to form a plastic housing, wherein the semiconductor chip 2 can be mounted and electrically contacted by means of the leadframe. In particular, such a plastic housing can be a surface-mountable housing. Furthermore, it is also possible for the carrier element 1 to be embodied as a so-called QFN package (QFN: "quad-flat no leads"). Furthermore, it is also possible for the carrier element to be embodied as a ceramic substrate or as a ceramic carrier, for example, to which conductor tracks are applied and/or in which plated-through holes are present, by means of which the semiconductor chip 2 can be mounted and/or electrically contacted.

The semiconductor chip 2 is covered with a protective layer 3 comprising parylene. In particular, the protective layer 3 can consist of parylene. In order to achieve all-round protection of the semiconductor chip 2 against damaging environmental influences such as moisture and damaging gases, the semiconductor chip 2 is covered by the protective layer 3 on all sides or surfaces facing away from the carrier element 1. For this purpose, the protective layer 3 is applied to the semiconductor chip 2 after the semiconductor chip 2 has been mounted and electrically connected on the carrier element 1. As an alternative thereto, it may also be possible firstly to cover the semiconductor chip 2 with the parylene protective layer 3 and then to mount it on the carrier element 1. This may be possible in particular if the semiconductor chip 2 has electrical contact elements, for example electrode layers, only on the side facing the carrier element 1. By way of example, the semiconductor chip 2 in this case can be embodied as a so-called flip-chip semiconductor chip.

It is particularly advantageous if the protective layer 3 comprises or consists of a fluorine-substituted parylene or a combination of two or more parylene derivatives, which has a high thermal stability and also a high stability and barrier effect with respect to damaging environmental influences. Furthermore, the protective layer 3 can also achieve protection in relation to mechanical actions by virtue of a high protection against abrasion.

The further figures show exemplary embodiments which form modifications of the exemplary embodiment illustrated in FIG. 1. Therefore, the following description relates substantially to the differences relative to the exemplary embodiment in FIG. 1.

Figure 2:
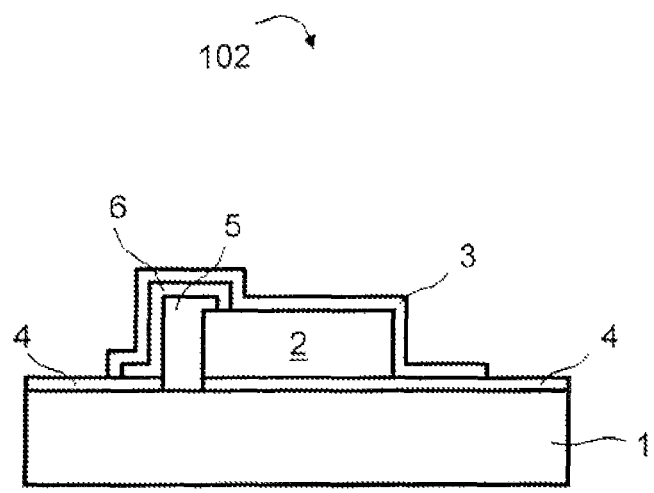
FIGS. 2 and 3 show schematic illustrations of optoelectronic semiconductor components in accordance with further exemplary embodiments.

FIG. 2 shows an optoelectronic semiconductor component 102 in accordance with a further exemplary embodiment, wherein the carrier element 1 has electrical connection elements 4 in the form of conductor tracks on the surface facing the semiconductor chip 2. The semiconductor chip 2 is mounted on one of the connection elements 4. By means of an electrical contact structure 6 embodied as metal film, the further electrical connection element 4 is electrically conductively connected to the top side and, arranged there, an electrical contact element, for example an electrode, of the semiconductor chip 2. An electrically insulating layer 5 composed of a dielectric inorganic material or a polymer material is arranged between the semiconductor chip 2 and the electrical contact structure 6 in order to electrically insulate the electrical contact structure 6 for example from side surfaces of the semiconductor chip 2.

As in the previous exemplary embodiment, the semiconductor chip 2 in the exemplary embodiment in FIG. 2 is covered on all surfaces facing away from the carrier element 1 by a protective layer 3 comprising or composed of parylene. However, in comparison with the previous exemplary embodiment, the protective layer 3 also extends onto a part of the carrier element 1 and thus forms a continuous protective layer 3 which extends from the semiconductor chip 2 onto the carrier element 1 and which additionally also covers the electrical contact structure 6. In particular, the protective layer 3 can extend for example over the entire side of the carrier element 1 facing the semiconductor chip 2, wherein connection regions of the electrical connection elements 4 for contacting the semiconductor component 102 remain free of the protective layer 3.

Figure 3:
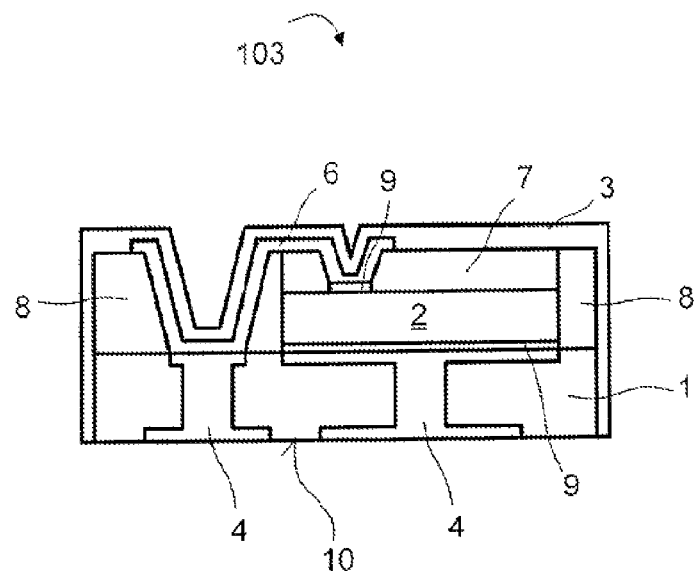

In FIG. 3 there is an optoelectronic semiconductor component 103 in accordance with a further exemplary embodiment. The optoelectronic semiconductor component 103 comprises a carrier element 1, for example composed of plastic or a ceramic material, which has at least two electrical connection elements 4 embodied as plated-through holes. The electrical connection elements 4 project from a mounting surface 10 of the carrier element 1, by means of which mounting surface the optoelectronic semiconductor component 103 can be mounted on a carrier, through the carrier element 1 to that side of the carrier element 1 which faces the semiconductor chip 2. As is shown in FIG. 3, the electrical connection elements 4 can have electrical connection regions at the surfaces of the carrier element 1 which are adapted to a predefined soldering design on the mounting surface 10 and to the type of contacting for the semiconductor chip 2.

The semiconductor chip 2 is mounted directly on one of the two electrical connection elements 4 and has an electrical contact element 9, for example in the form of a solder layer or an electrode layer, for electrically connecting the top side of the semiconductor chip 2 to the electrical connection element 4. A wavelength conversion layer 7 is applied on the semiconductor chip 2 and is designed, as described above in the general part, to convert at least part of the light emitted by the semiconductor chip 2 during operation into light having a different wavelength. The wavelength conversion layer 7 can be embodied as described above in the general part.

The semiconductor chip 2 and also the wavelength conversion layer 7 are surrounded by a potting material 8 laterally, that is to say along a direction parallel to the interface between the semiconductor chip 2 and the carrier element 1. The potting material 8 can comprise or be composed of silicone, for example, and, as illustrated in the exemplary embodiment shown, can be adjacent to the wavelength conversion layer 7 in a planar fashion, such that the optoelectronic semiconductor component 103 has a substantially planar surface.

For the purpose of making contact with the top side of the semiconductor chip 2 or the electrical contact element 9 present there, an opening is provided in the wavelength conversion layer 7. Arranged in the opening there is an electrical contact structure 6 in the form of a metal film extending from the electrical contact element 9 on the top side of the semiconductor chip 2 to the other electrical connection element 4. For this purpose, a corresponding opening is also provided in the potting material 8. The electrical contact element of the semiconductor chip 2 is thus electrically conductively connected to the other of the at least two electrical connection elements 4 of the carrier element 1 by means of the contact structure 6 formed by a metal film, wherein the electrical contact structure 6 extends through an opening in the potting material 8 to the connection element 4. As an alternative thereto, it is also possible for the wavelength conversion layer to be applied on the semiconductor chip 2 only after the electrical contacting of the semiconductor chip, that is to say after the formation of the contact structure 6, such that the wavelength conversion layer can also cover the electrical contact structure 6.

Furthermore, a protective layer 3 comprising or composed of a parylene is arranged on all surfaces of the semiconductor component 103 apart from the mounting surface 10 of the carrier element 1, with the result that the protective layer 3 covers all surfaces of the semiconductor component 103 apart from the mounting surface 10 and forms an outer layer of the semiconductor component 103. What can be achieved as a result is that after mounting of the semiconductor component 103 on a carrier 11, as is shown in FIG. 4, all surfaces of the semiconductor component 103 which face the surroundings are formed by the protective layer 3, as a result of which materials of the semiconductor component 103 which are sensitive to moisture and damaging gases, such as, for example, the potting material 8, metal surfaces, which can comprise for example Ni/Au, Cu, Al, Ag or combinations thereof, and the semiconductor material of the semiconductor chip 2 are protected.

Figure 4:
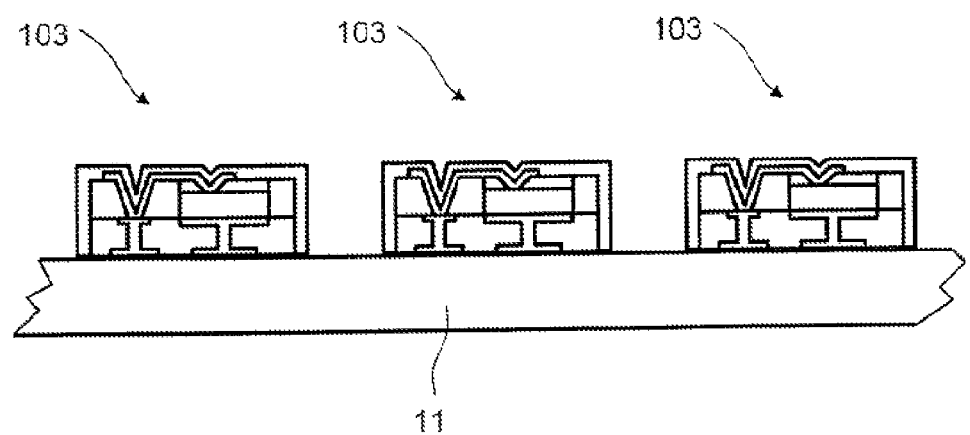
FIG. 4 shows a schematic illustration of an arrangement of optoelectronic semiconductor components on a carrier in accordance with a further exemplary embodiment.

FIG. 4 shows an arrangement of a plurality of optoelectronic semiconductor components 103 in accordance with the previous exemplary embodiment on a carrier 11, which is formed for example by a printed circuit board or a heat sink, for example a mounting plate. The arrangement of the optoelectronic semiconductor components 103 can for example also be implemented in a two-dimensional matrix. As described in association with FIG. 3, the optoelectronic semiconductor components 103 are protected against damaging environmental influences by the parylene protective layer 3, such that the arrangement shown in FIG. 4 can be used for example as a lighting element, for instance in automotive applications, without additional encapsulation or protection measures.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

This patent application claims the priority of German patent application 10 2012 109 177.3 the disclosure content of which is hereby incorporated by reference.

The invention claimed is:

1. An optoelectronic semiconductor component, comprising
    a carrier element, on which an optoelectronic semiconductor chip having at least one active layer is arranged,
    wherein the active layer is designed to emit or to receive light during operation and the semiconductor chip is covered with a protective layer comprising parylene,
    wherein the carrier element has a mounting surface facing away from the optoelectronic semiconductor chip,
    wherein the semiconductor chip is laterally surrounded by a potting material, and the protective layer completely covers all surfaces of the semiconductor component apart from the mounting surface and forms an outer layer of the semiconductor component,
    wherein the carrier element has at least two electrical connection elements which are embodied as plated-through holes and which extend from the mounting surface facing away from the semiconductor chip through the carrier element as far as that side of the carrier element which faces the semiconductor chip,
    wherein the optoelectronic semiconductor component further comprises a wavelength conversion layer,
    wherein the semiconductor chip and the wavelength conversion layer are surrounded by a potting material,
    wherein electrical contact with a top side of the semiconductor chip remote from the carrier element is realized through an opening in the wavelength conversion layer, an electrical contact structure in the form of a metal film is arranged in the opening,
    wherein a corresponding opening containing the electrical contact structure is provided in the potting material so that the electrical contact structure partially runs on top faces of the wavelength conversion layer and of the potting material remote from the carrier element, and
    wherein the electrical contact structure is in contact with one of the plated-through holes that is located beside the semiconductor chip when seen on the top side.

2. The semiconductor component according to claim 1, wherein the protective layer consists of parylene.

3. The semiconductor component according to claim 1, wherein the parylene is a fluorine-substituted parylene and/or a combination of two or more parylene derivatives.

4. The semiconductor component according to claim 1, wherein the protective layer forms an outer layer of the semiconductor component.

5. The semiconductor component according to claim 1, wherein the protective layer covers at least one part of the carrier element.

6. The semiconductor component according to claim 5, wherein the protective layer extends continuously from the semiconductor chip onto the carrier element.

7. The semiconductor component according to claim 1, wherein the electrical contact structure electrically conductively connects at least one electrical connection element of the carrier element to an electrical contact element of the semiconductor chip, and the electrical contact structure is covered by the protective layer.

8. The semiconductor component according to claim 1, wherein the potting material comprises a silicone.

9. The semiconductor component according to claim 1, wherein the optoelectronic semiconductor chip is a light emitting semiconductor chip.

10. An optoelectronic semiconductor component, comprising
    a carrier element, on which an optoelectronic semiconductor chip having at least one active layer is arranged,
    wherein the active layer is designed to emit or to receive light during operation and wherein the semiconductor chip is covered with a protective layer comprising parylene,
    wherein the carrier element has a mounting surface facing away from the optoelectronic semiconductor chip, the semiconductor chip is laterally surrounded by a potting material, and the protective layer covers all surfaces of the semiconductor component apart from the mounting surface and forms an outer layer of the semiconductor component, and
    wherein the carrier element has at least two electrical connection elements which are embodied as plated-through holes and which extend from the mounting surface facing away from the semiconductor chip through the carrier element as far as that side of the carrier element which faces the semiconductor chip.

* * * * *